United States Patent [19]
Duong et al.

[11] Patent Number: 5,880,492
[45] Date of Patent: *Mar. 9, 1999

[54] DEDICATED LOCAL LINE INTERCONNECT LAYOUT

[75] Inventors: Khue Duong; Stephen M. Trimberger, both of San Jose, Calif.

[73] Assignee: XILINX, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 543,532

[22] Filed: Oct. 16, 1995

[51] Int. Cl.$^6$ .................................................. H01K 27/10
[52] U.S. Cl. .......................................... 257/209; 257/207
[58] Field of Search .................................. 257/208, 209, 257/210, 211

[56] References Cited

U.S. PATENT DOCUMENTS 5,576,554  11/1996  Hsu ........................................ 257/209

*Primary Examiner*—David B. Hardy
*Attorney, Agent, or Firm*—Anthony C. Murabito; Michael R. Casey; Jeanette S. Harms

[57] ABSTRACT

An electrical connection arrangement for a programmable integrated circuit is provided. An electrical device is disposed proximate to a vertical longline which is used for transporting address and data signals. The electrical device includes a vertical address line extending from the device. A horizontally arranged interconnection line is electrically connected to the vertical address line extending from the device. Furthermore, the horizontally arranged interconnection line is programmably connectable to the vertical longline. By electrically hardwire connecting the horizontally arranged interconnection line to the vertical address line extending from the device, only one programmable interconnect point is required to transfer signals from the vertical longline into the electrical device itself. Thus, impedance is reduced, while addressing speed is improved. Also, by adding additional horizontal interconnect lines, the present invention reduces routing barriers.

9 Claims, 4 Drawing Sheets

DEDICATED LOCAL LINE INTERCONNECT LAYOUT

BACKGROUND OF THE INVENTION

1. Field of the Invention

This invention relates to the field of programmable interconnect structures within an integrated circuit. More specifically, the present invention relates to local interconnect lines contained within field programmable gate arrays.

2. Background Technology

Programmable integrated circuits, specifically field programmable gate arrays (FPGAs) typically include configurable logic blocks (CLBs) and a programmable interconnect structure. Typically, the interconnect structure is used for providing signals to the CLBs, for routing signals between CLBs, and for routing signals to other devices within the FPGA. Routing of signals, especially address signals, from global longlines to a look-up table (LUT) of a CLB is important to programmable integrated circuits, such as FPGAs. Often, a LUT can be configured as a memory, with address lines which extend both vertically and horizontally from the CLB within the semiconductor substrate. The address lines are then electrically coupled to vertically arranged global longlines disposed near columns of CLBs. The global longlines are used to supply common addressing signals to a plurality of CLBs and, as such, extend across a large portion of the FPGA.

FIG. 1, illustrates a CLB 10, which includes a LUT 12, and a plurality of global longlines 14a–14f. Horizontal local interconnect lines 16a–16d are provided above and below CLB10. Horizontal input/output lines 18a–18d, hereinafter referred to as horizontal input/output lines, hereinafter referred to as address lines, extend horizontally from LUT 12. Additionally, vertical address lines 20a–20d, extend vertically from LUT 12. Horizontal address lines 18a–18b are electrically coupled to desired global longlines using a programmable interconnect points (PIPS) such as PIPs 22a–22d positioned at line intersections. Prior art FIG. 2 illustrates a diagrammatic and a more detailed representation of a PIP 30 including a transistor 36a coupled between lines 32 and 34. If programmed ON via a programmable memory cell 36b, transistor 36a couples line 32 and 34. If transistor 36a is programmed OFF, lines 32 and 34 are not connected.

In prior art configurations, to connect the vertical address lines to the global longlines of FIG. 1, two PIPs are required because the vertical address lines are parallel to the global longlines. For example, as shown in FIG. 1, PIP 24b and PIP 24a are required to connect vertical address line 20a to global longline 14b. Specifically, PIP 24b couples address line 20a to horizontal interconnect line 16b, and PIP 24a couples local interconnect line 16b to global longline 14b. The use of multiple PIPs increases impedance and reduces signal speed. Furthermore, using PIPs on horizontal interconnect line 16b to address LUT 12 prevents horizontal interconnect line 16b from being used for other routing purposes. Thus, when the number of vertical address lines increases, the number of horizontal interconnect lines available for other routing purposes is correspondingly reduced. Therefore, multiple PIP connection schemes create a substantial routing barrier within an FPGA. Thus, a need exists for an interconnection mechanism or structure which minimizes the number of PIPs, and which eliminates routing barriers associated with the prior art.

SUMMARY OF THE INVENTION

An electrical connection arrangement for a programmable integrated circuit is described. An electrical device is disposed proximate to a vertical arranged longline which is used for transporting address and data signals. The electrical device has a vertical address line extending from the device. A horizontally arranged interconnection line is permanently connected to the vertical address line extending from the device. Furthermore, the horizontally arranged interconnection line is programmably connectable to the vertical longline arranged proximate to the electrical device. By permanently connecting the horizontally arranged interconnection line to the vertical address line extending from the device, only one programmable interconnect point is required to transfer signals from the vertical longline into the electrical device. Thus, impedance is reduced, while addressing speed is improved. Also, by adding additional horizontal interconnect lines, the present invention reduces routing barriers.

In one embodiment of the present invention the electrical device includes a configurable logic block having a look-up table. The vertical address line extends from the look-up table and is hardwire connected to the horizontal local interconnect line. The horizontally arranged local interconnect line is disposed across a vertical global longline for programmably coupling thereto. Also included in one embodiment is a second horizontal local interconnect line disposed across the vertical global longline and the vertical address line. The second horizontally arranged local interconnect line is adapted to programmably couple to the vertical address line.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE DRAWINGS

Figure 1:
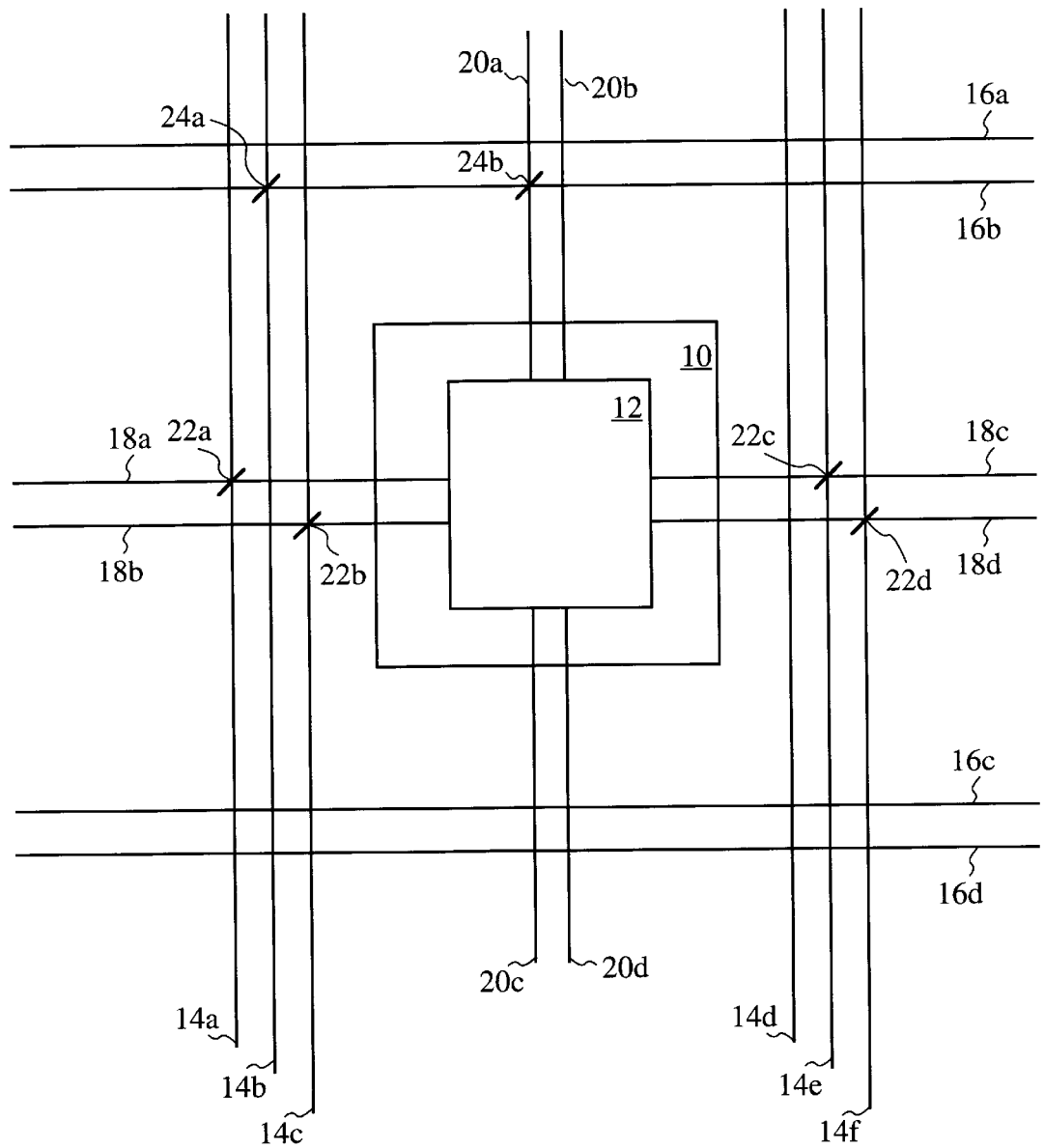
FIG. 1 illustrates a CLB and a prior art interconnect structure accommodating both horizontal and vertical LUT address lines.
Figure 2:
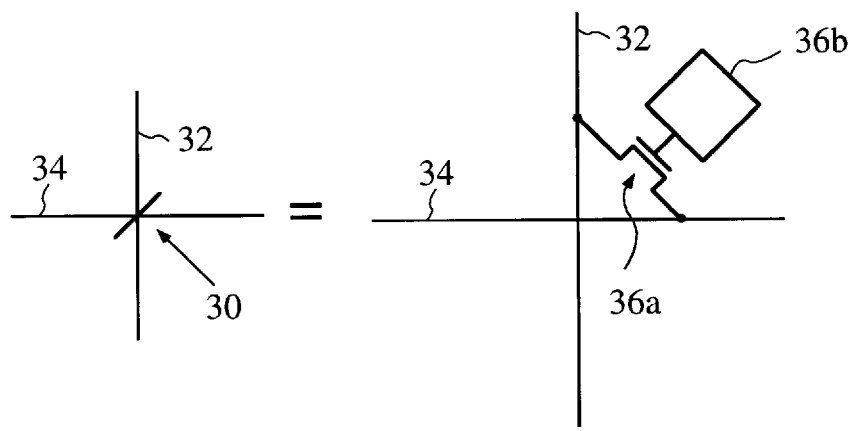
FIG. 2 shows an exemplary programmable interconnect point used to electrically connect lines.
Figure 3:
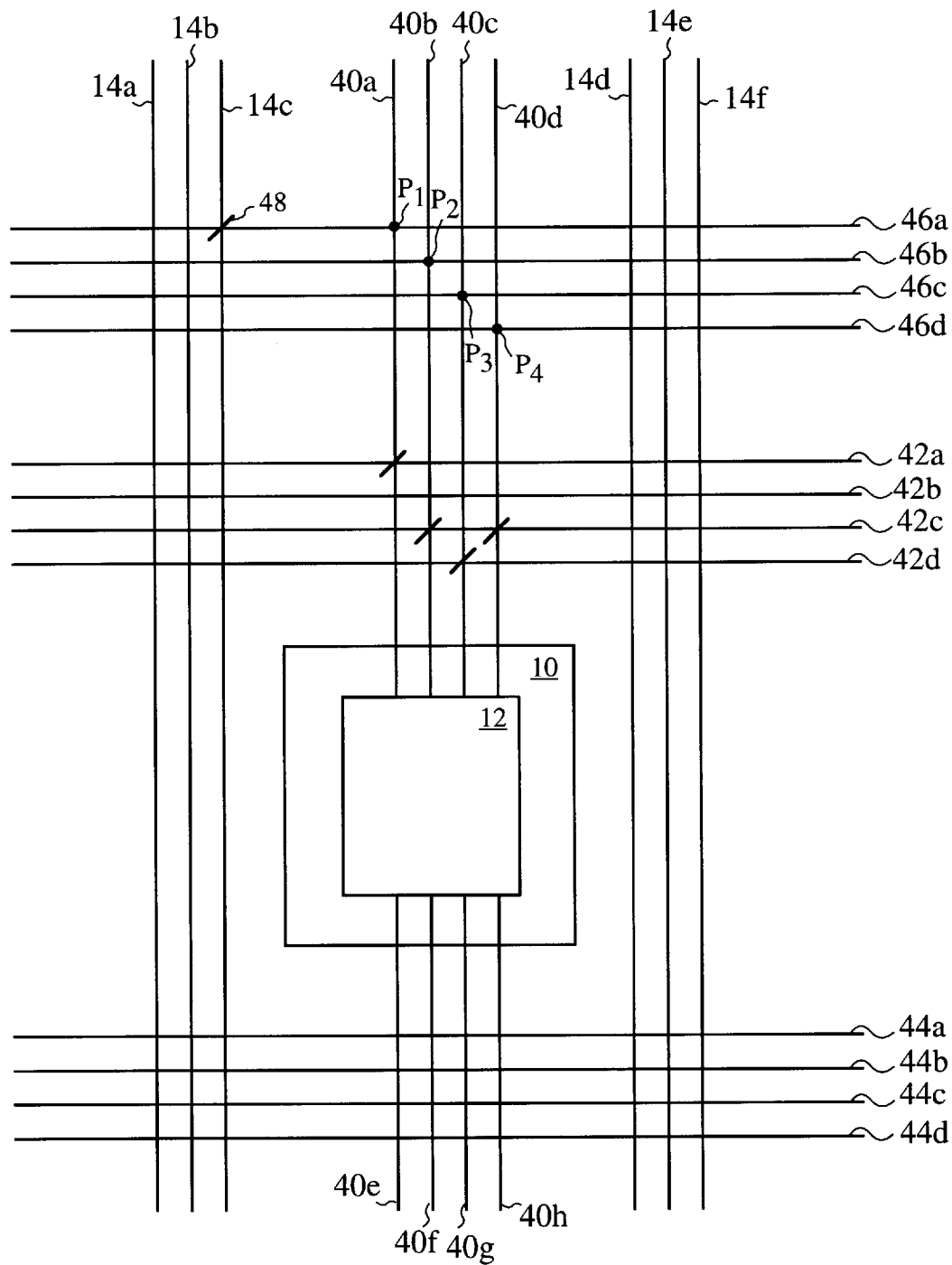
FIG. 3 illustrates a CLB and an interconnect structure which requires only a single PIP to connect vertical oriented address lines to a desired parallel global longline in accordance with the present invention.

FIG. 3 illustrates CLB 10 and an interconnect structure in accordance with the present invention which requires only a single PIP to connect a vertical oriented address lines to a desired global longline. In FIG. 3, CLB 10, which includes LUT 12, is bordered by global longlines 14a–14f. Likewise, CLB 10 is also bordered by horizontal local interconnect lines 42a–42d, 44a–44d, and 46a–46d. In the present embodiment, vertical address lines 40a–40h extend vertically from LUT 12. Although four address lines extend from both the top and bottom of CLB 10 in the present embodiment, this number is exemplary only and the present invention is well suited to having various numbers of address lines extending vertically in either direction from CLB 10. Furthermore, the present invention is also well suited to accommodating address lines extending horizontally from CLB 10 described in detail in reference to FIG. 4.

In the embodiment shown in FIG. 3, horizontal interconnect lines 46a–46d are "dedicated" interconnect lines used to electrically couple global longlines to a selected address line. For example, address line 40a is hardwire-connected to horizontal interconnect line 46a at point $P_1$. Likewise, address line 40b is hardwire-connected to horizontal interconnect line 46b at point $P_2$, address line 40c is hardwire-connected to horizontal interconnect line 46c at point $P_3$, and address line 40d is hardwire-connected to horizontal interconnect line 46d at point $P_4$.

By permanently or "hardwire" connecting horizontal interconnect lines 46a–46d to address lines 42a–42d, respectively, the present invention requires only a single PIP to couple a vertical address line to a parallel global longline. For example, because vertical address line 40a is hardwire connected to horizontal interconnect line 46a at point $P_1$, a single PIP 48 can programmably couple global longline 14c, via horizontal interconnect line 46a, to vertical address line 40a. Stated another way, an address signal routed from global longline 14c, through point P1, and into CLB 10, only encounters a single PIP, PIP 48. Thus, the present invention eliminates the need for two PIPs when coupling a global longline to a parallel address line from LUT 12. By eliminating one of the previously required PIPs, impedance is reduced and addressing speed is improved.

Additionally, by adding dedicated horizontal interconnect lines 46a–46d, the present invention allows horizontal lines 42a–42d to be used for other routing purposes. That is, in the prior art, using a PIP on a horizontal interconnect line to address a LUT prevented that horizontal interconnect line from being used for other routing purposes. Thus, when the number of vertical address lines increased, the number of horizontal interconnect lines available for other routing purposes was correspondingly reduced. The present invention frees up the existing horizontal interconnect lines for necessary routing purposes. Such necessary routing purposes include, but are not limited to, transmitting clock signals, carrying address and data signals to other CLBs, transferring inputs from I/O pads, and the like. Thus, the present invention reduces routing barriers associated with the prior art two-PIP routing schemes.

With reference still to FIG. 3, although not shown in the present embodiment for purposes of clarity, the present invention is also well suited to having additional dedicated horizontal interconnect lines, for example horizontal interconnect lines 44a–44d, located beneath CLB 10. Furthermore, in other embodiments, some of horizontal interconnect lines 46a–46d may extend only to the left to connect to longlines 14a–14c, whereas other horizontal interconnect lines extend only to the right to connect to longlines 14d–14f, whereas other horizontal interconnect lines extend to both the left and right.

Figure 4:
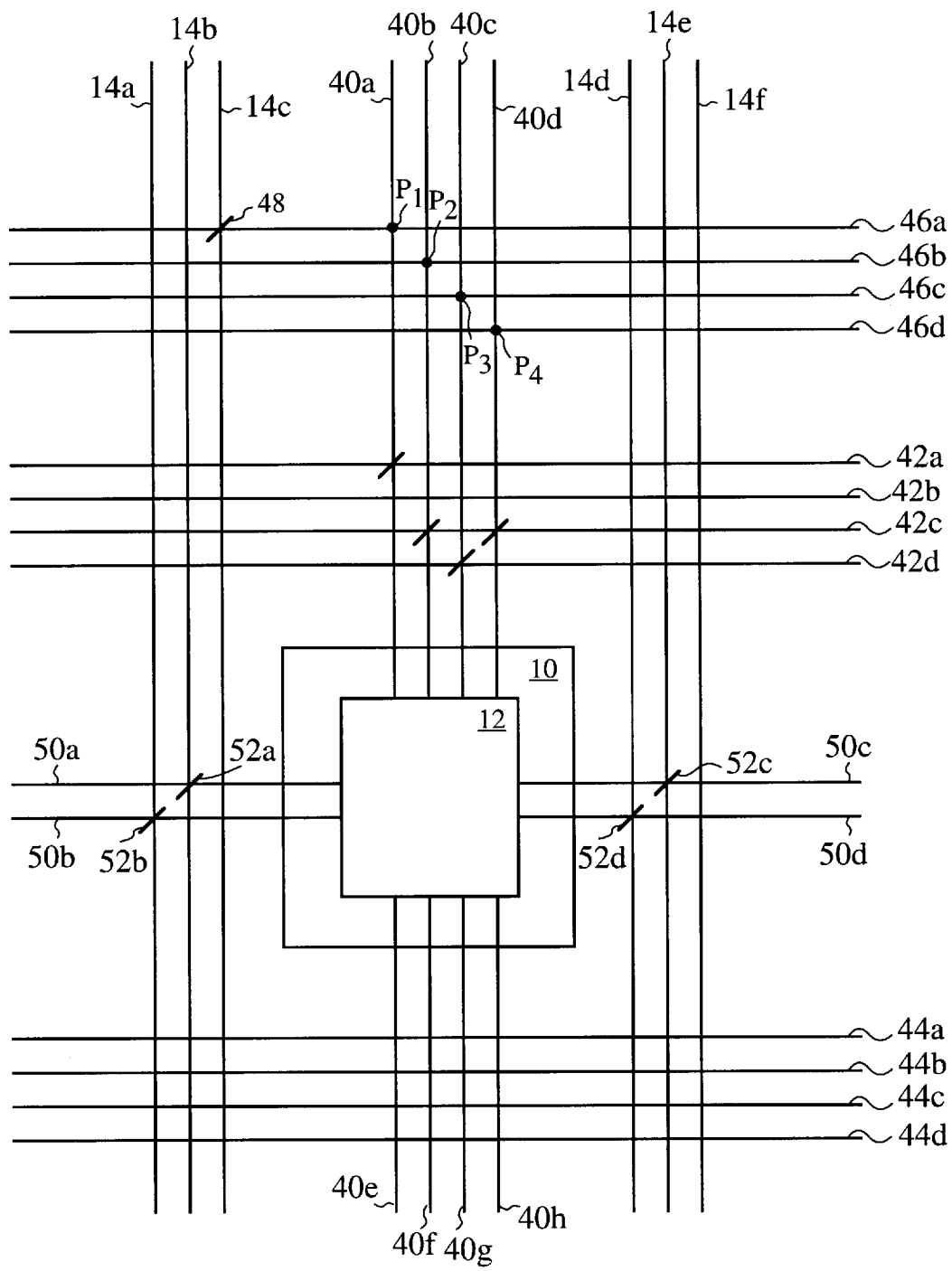
FIG. 4 shows a CLB and an interconnect structure having horizontal address lines extending therefrom, and which requires only a single PIP to connect vertical oriented address lines to a desired parallel global longline in accordance with the present invention.

FIG. 4, illustrates a CLB 10 having both horizontal and vertical address lines. This embodiment, similar to the embodiment of FIG. 3, also requires only a single PIP to connect a vertical address lines to a desired global longline. However, in the embodiment of FIG. 4, address lines 50a–50d extend horizontally from CLB 10. Because horizontal address lines 50a–50d are perpendicular to global longlines 14a–14f, only a single PIP is needed to connect any horizontal address line to a global longline. For example, horizontal address line 50a is programmably coupled to global longline 14b using PIP 52a, horizontal address line 50b is programmably coupled to global longline 14a using PIP 52b, horizontal address line 50c is programmably coupled to global longline 14e using PIP 52c, and horizontal address line 50d is programmably coupled to global longline 14d using PIP 52d.

The foregoing descriptions of specific embodiments of the present invention have been presented for purposes of illustration and description. They are not intended to be exhaustive or to limit the invention to the precise forms disclosed. Those skilled in the art will recognize that modifications and variations are possible in light of the above teaching. The embodiments were chosen and described in order to best explain the principles of the invention and its practical application, to thereby enable others skilled in the art to best utilize the invention. It is intended that the scope of the invention only be defined by the claims appended hereto and their equivalents.

We claim:

1. A method of distributing signals in a programmable integrated circuit comprising:

disposing at least one logic block proximate to a first vertical line;

extending a plurality of vertical lines from said logic block, wherein said first vertical line is separate from said plurality of vertical lines;

permanently connecting a first plurality of horizontal interconnection lines to said plurality of vertical lines, wherein each vertical line of said plurality of vertical lines is non-programmably hardwired to one of said plurality of horizontal interconnection lines;

programmably coupling at least one of said first plurality of horizontal interconnection lines, which is non-programmably hardwired to one of said plurality of vertical lines, to said first vertical line; and programmably coupling said plurality of vertical lines to a second plurality of horizontal interconnection lines, wherein said plurality of vertical lines traverse said first and second plurality of horizontal lines.

2. An electrical connection arrangement for a programmable integrated circuit comprising:

a first vertical line disposed proximate to a logic block in said programmable integrated circuit;

a plurality of vertical lines extending from said logic block, wherein said first vertical line is separate from said plurality of vertical lines;

a first set of horizontal lines, wherein each of said plurality of vertical lines is non-programmably hardwired to one of said first set of horizontal lines, and wherein at least one of said first set of horizontal lines is programmably coupled to said first vertical line and non-programmably hardwired to one of said plurality of vertical lines; and a second set of horizontal lines, wherein each of said plurality of vertical lines is programmably coupled to one of said second set of horizontal lines, wherein said plurality of vertical lines traverse said first and second plurality of horizontal lines.

3. The electrical connection arrangement of claim 2 wherein said plurality of vertical lines are address lines for addressing said logic block.

4. The electrical connection arrangement of claim 2 wherein said first vertical line is a global line for transferring address and data signals.

5. The electrical connection arrangement of claim 2 further comprising a first horizontal line extending from said logic block and programmably coupled to said first vertical line, wherein said first horizontal line is separate from said first and second sets of horizontal lines.

6. The electrical connection arrangement of claim 5 wherein said third horizontal line is an address line for addressing said logic block.

7. An interconnection in a programmable logic device comprising:
- a vertical global long line disposed proximate to a configurable logic block in said programmable logic device;
- a vertical address line extending from said configurable logic block;
- a first horizontal local interconnect line non-programmably hardwired to said vertical address line and programmably connected to said vertical global long line; and
- a second horizontal local interconnect line programmably connected to said vertical address line.

8. The interconnection of claim 7 further comprising a horizontal address line extending from said configurable logic block and programmably coupled to said vertical global long line.

9. The interconnection of claim 8 wherein said configurable logic block includes a look-up table, wherein said vertical and horizontal address lines extend from said look-up table.

* * * * *